United States Patent
Rangasayee et al.

(10) Patent No.: US 6,263,400 B1
(45) Date of Patent: *Jul. 17, 2001

(54) MEMORY CELLS CONFIGURABLE AS CAM OR RAM IN PROGRAMMABLE LOGIC DEVICES

(75) Inventors: Krishna Rangasayee, Sunnyvale; Robert N. Bielby, Pleasanton, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/523,055

(22) Filed: Mar. 10, 2000

Related U.S. Application Data

(63) Continuation of application No. 09/321,671, filed on May 28, 1999, now Pat. No. 6,058,452, which is a continuation of application No. 08/918,687, filed on Aug. 21, 1997, now Pat. No. 5,940,852.

(51) Int. Cl.[7] .................................................. G11C 15/00
(52) U.S. Cl. ............................................. 711/108; 365/49
(58) Field of Search .............................. 711/108; 365/49, 365/154, 189.07, 202

(56) References Cited

U.S. PATENT DOCUMENTS

| | | | |
|---|---|---|---|
| Re. 34,363 | * 8/1993 | Freeman | 307/465 |
| 4,646,271 | * 2/1987 | Uchiyama et al. | 365/49 |
| 4,740,917 | * 4/1988 | Denis et al. | 365/49 |
| 5,022,006 | * 6/1991 | Fifield et al. | 365/200 |
| 5,383,146 | * 1/1995 | Threewitt | 365/49 |
| 5,408,434 | * 4/1995 | Stansfield | 365/189.08 |
| 5,490,102 | * 2/1996 | Jubran | 365/49 |
| 5,550,782 | * 8/1996 | Cliff et al. | 365/230.03 |
| 5,559,747 | * 9/1996 | Kasamizugami et al. | 365/207 |
| 5,577,215 | * 11/1996 | Lee et al. | 365/49 |
| 5,642,114 | * 6/1997 | Komoto et al. | 341/67 |
| 5,706,224 | * 1/1998 | Srinivasan et al. | 365/49 |
| 5,706,231 | * 1/1998 | Kokubo | 365/200 |
| 5,761,145 | * 6/1998 | Zagar et al. | 365/226 |
| 5,970,008 | * 10/1999 | Zagar et al. | 365/226 |

FOREIGN PATENT DOCUMENTS

0612154 A1 * 8/1994 (EP).

* cited by examiner

Primary Examiner—Kevin Verbrugge
(74) Attorney, Agent, or Firm—Beyer Weaver & Thomas LLP

(57) ABSTRACT

A programmable logic device having content addressable memory is disclosed. In a preferred embodiment, the programmable logic device includes reconfigurable dual mode memory suitable for operating as a content addressable memory in a first mode and a random access memory in a second mode is disclosed. Mode control switch circuitry may be provided to selectively enable a user to configure the dual mode memory as either content addressable memory or random access memory.

18 Claims, 7 Drawing Sheets

MEMORY CELLS CONFIGURABLE AS CAM OR RAM IN PROGRAMMABLE LOGIC DEVICES

This is a Continuation application of prior Application Ser. No. 09/321,671 filed on May 28, 1999, now U.S. Pat. No. 6,058,452, which is a continuation of 08/918,687, filed Aug. 21, 1997 now U.S. Pat. No. 5,940,852 the disclosure of which is incorporated herein by reference.

BACKGROUND OF THE INVENTION

1. Field of the Invention

In one aspect, the present invention relates generally to programmable logic devices that incorporate reconfigurable dual mode memory. In another aspect, reconfigurable dual mode memory that is arranged to function as either CAM or RAM is described.

2. Description of the Related Art

A programmable logic device or PLD is a programmable integrated circuit that allows the user of the circuit, using software control, to customize the logic functions the circuit will perform. The logic functions previously performed by small, medium, and large scale integration integrated circuits can instead be performed by programmable logic devices. When a typical programmable logic device is supplied by an integrated circuit manufacturer, it is not yet capable of performing any specific function. The user, in conjunction with software supplied by the manufacturer or created by the user or an affiliated source, can program the PLD to perform the specific function or functions required by the user's application. The PLD then can function in a larger system designed by the user just as though dedicated logic chips were employed. For the purpose of this description, it is to be understood that a programmable logic device refers to once programmable as well as reprogrammable devices.

Programmable logic encompasses all digital logic circuits configured by the end user, including field programmable gate arrays (FPGAs) and complex PLDs (CPLDs). An example of a CPLD is known as the embedded array programmable logic device. Embedded array programmable logic devices utilize a plurality of embedded array blocks, or EABs, programmably interconnected to form a memory and logic array to implement memory and specialized logic functions. General logic functions are implemented by use of a logic array consisting of programmably interconnected logic array blocks, or LABs. By suitably programmably interconnecting the array of EABs and the array of LABs, an embedded array programmable logic device is capable of implementing many complex logic and combined logic/memory functions.

The embedded array programmable logic device architecture may be formed by a plurality of logic array blocks arranged in rows and columns coupled by way of programmable connectors to a plurality of horizontal and vertical conductors. In a similar manner, an array of embedded array blocks may be arranged such that at least one EAB is present in every row of logic array blocks. The array of EABs are also coupled to the plurality of horizontal and vertical conductors by way of a plurality of programmable connectors. By way of example, FIG. 1 is an illustration of an embedded array programmable logic device architecture as exemplified by the FLEX10K™ logic family of devices manufactured by the Altera Corporation of San Jose, California. As described above, logic array blocks 104a and 104b are arranged to form a portion of a row 150 which contains a single embedded array block 102a. A second row 152 is formed in a substantially similar manner, a portion of which includes the arrangement of logic array blocks 104c and 104d and embedded array block 102b.

As described above, each LAB and EAB may be programmably coupled to the plurality of vertical and horizontal conductors by appropriately situated programmable connectors. As an example, LAB 104a included in a portion of row 150 may be electrically coupled to a first plurality of horizontal conductors 174 and a second plurality of horizontal conductors 176 by programmable connectors 180 and 182, respectively. In a similar fashion, LAB 104a may be electrically coupled to a first plurality of vertical conductors 190 and a second plurality of vertical conductors 192 by programmable connectors 194 and 196, respectively. In a similar fashion each of the array of EABs may be electrically coupled to at least one of each of the plurality of vertical and horizontal conductors. By way of example, EAB 102a may be electrically coupled to vertical conductors 192 and 191 by way of programmable connectors 195 and 197, respectively, and horizontal conductors 174 and 176 by way of programmable connectors 193 and 199, respectively. In this way, an embedded array programmable logic device capable of implementing many complex logic and combined logic/memory functions is formed.

The EAB is a flexible block of random access memory, or RAM, with registers on the input and output ports. As is known in the art, a RAM is an array of individual memory cells, of which each cell includes a plurality of transistors configured to store digital data in the form of a single bit. Typically, the individual memory cells are arranged to form data words of varying length depending upon the particular application. In practice, data words may be of any length, however, data word lengths of 1, 8, 16, or 32 bits are common but any word length desired by the user is possible. As structured, the RAM device has the ability to access, or read, each stored data bit or data word independently of any other stored data bit or word by selectively enabling desired rows and columns.

Many applications such as database machines, image or voice recognition, or computer and communication networks require high speed searches of data bases, lists, or patterns. Commonly, high speed searches using RAM employ search algorithms such as binary, tree-based searches, or look aside tag buffers. Unfortunately, the structure of the RAM requires these algorithms to sequentially compare the desired information against the pre-stored data within the RAM in a manner that is relatively slow, thereby leading to unacceptable search times.

To address the need for high speed searches in large data bases, lists or patterns, a device known in the art as the content addressable memory, or CAM, was developed. The CAM is a memory device that accelerates the applications such as database machines, image or voice recognition, or computer and communications networks that require fast searches of a data base, list, or pattern. CAMs may have significant performance advantages over use of RAM in performing high speed searches of databases, lists, and patterns since CAMs compare the entire list of prestored data simultaneously. Typically, in performing high speed searches, the CAM based search engine delivers up to an order of magnitude faster performance than a RAM based search engine.

In view of the foregoing, it would be advantageous and therefore desirable to provide a programmable logic device having an efficient configurable content addressable memory cell.

SUMMARY OF THE INVENTION

To achieve the foregoing and other objects and in accordance with the purpose of the present invention, a programmable logic device having content addressable memory is disclosed. In a preferred embodiment, reconfigurable dual mode memory suitable for operating as a content addressable memory in a first mode and a random access memory in a second mode is disclosed. Mode control switch circuitry may be provided to selectively enable a user to configure the dual mode memory as either content addressable memory or random access memory.

In one preferred embodiment, the dual mode memory block includes a multiplicity of dual mode memory cells having a plurality of columns and rows suitably arranged to outputting match addresses corresponding to requested data words when the dual mode memory block is configured to operate as content addressable memory.

The dual mode memory cells may also include a plurality of dual mode memory cell data lines, a row line, a match line, a data storage circuit for storing data, a comparison circuit for comparing the stored data with requested data, and an isolation circuit for selectably isolating the data storage circuit and the comparison circuit.

The programmable logic device may also include a comparand unit for storing and queuing requested data and a priority encoder. The priority encoder being suitable for receiving and storing match addresses as well as generating a sysmatch flag indicative of a MATCH or a NO MATCH condition.

In another embodiment, the reconfigurable programmable logic device includes an array of programmably interconnected logic cells suitable for use in implementing programmed logic functions. The reconfigurable programmable logic device also includes a dual mode memory block programmably coupled to the array of logic cells. The dual mode memory block may be arranged to operate as a content addressable memory in a first mode or random access memory in a second mode.

The programmable logic device also includes a mode control switch circuit coupled to the content addressable memory block. The mode control switch circuit enables the dual mode memory block to operate as a content addressable memory block or a random access memory block. In another embodiment, the dual mode memory block may operate as a static random access memory block.

In yet another embodiment, the reconfigurable programmable logic device includes an array of programmably interconnected logic cells suitable for use in implementing programmed logic functions and a content addressable memory block programmably coupled to the array of logic cells. The content addressable memory to block arranged to output address locations corresponding to requested data words. The reconfigurable logic device may also include a mode control switch circuit coupled to the content addressable memory block. The mode control switch circuit may enable the content addressable memory block to operate as a random access memory block.

In still another embodiment, a programmable logic device utilizing an embedded logic array block architecture configured as dual mode memory is disclosed. The programmable logic device includes an array of programmably interconnected logic blocks suitable for use in implementing programmed logic functions. The programmable logic device also includes a dual mode memory block programmably coupled to the array of logic blocks. In this embodiment, the dual mode memory block is arranged to function as content addressable memory in a first mode and to function as random access memory in a second mode.

A dual mode memory circuit being arranged to function as content addressable memory in a first mode and as random access memory in a second mode is also disclosed. The dual mode memory cell includes a data storage circuit for storing data, a comparison circuit for comparing data stored in the data storage circuit with requested data, a match line for indicating whether the stored data and the requested data match, and an isolation circuit for electrically isolating the data storage circuit from the comparison circuit and match line.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

The invention relates generally to providing programmable logic devices with content addressable memory. In a preferred embodiment, the content addressable memory is configured to operate as a dual mode memory such that in a first mode the memory operates as a content addressable memory, or CAM. In a second mode, memory operates solely as a RAM such as a static random access memory device, or SRAM.

Figure 1:
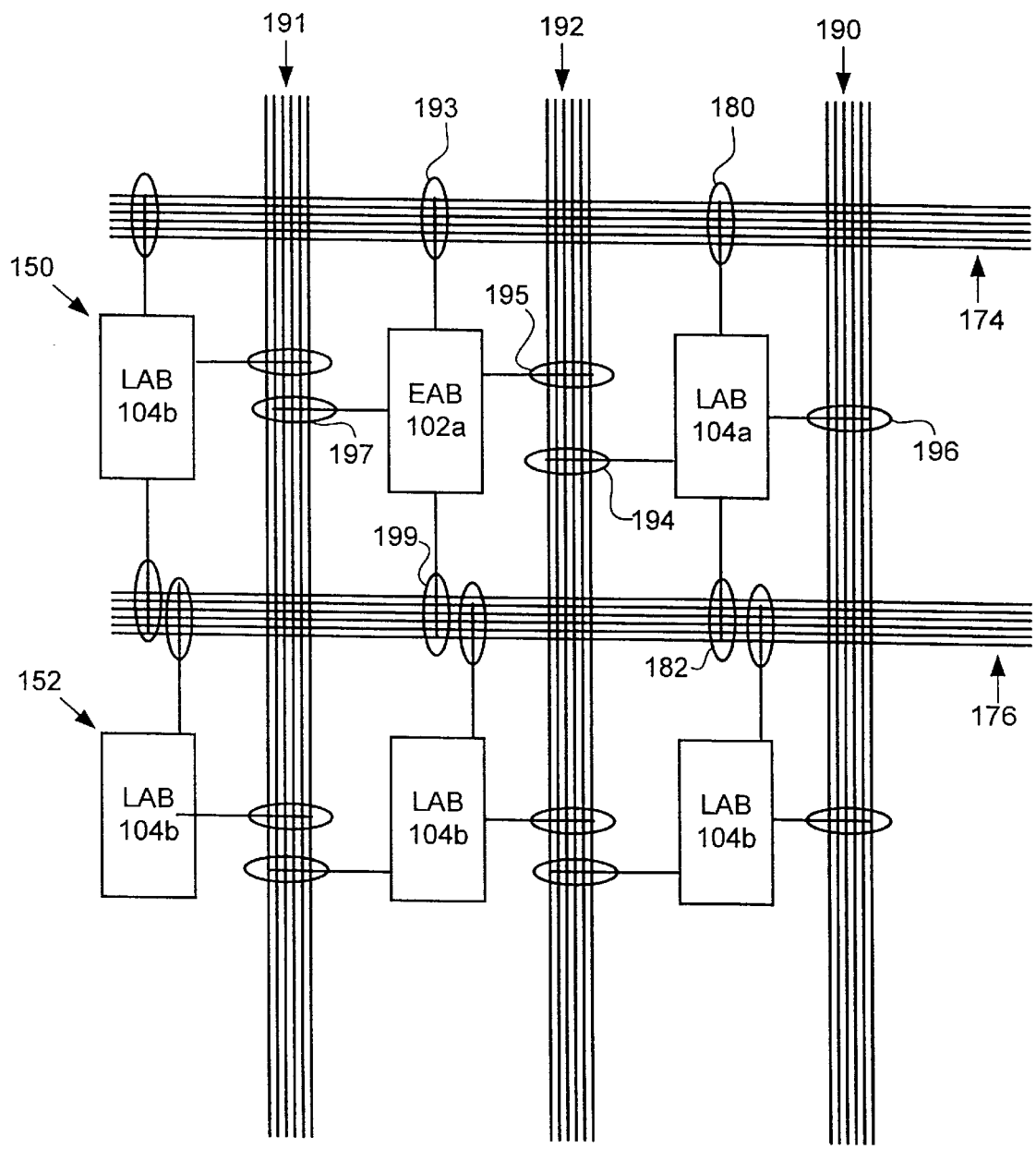
FIG. 1 is an illustration of an embedded array programmable logic device architecture.
Figure 2A:
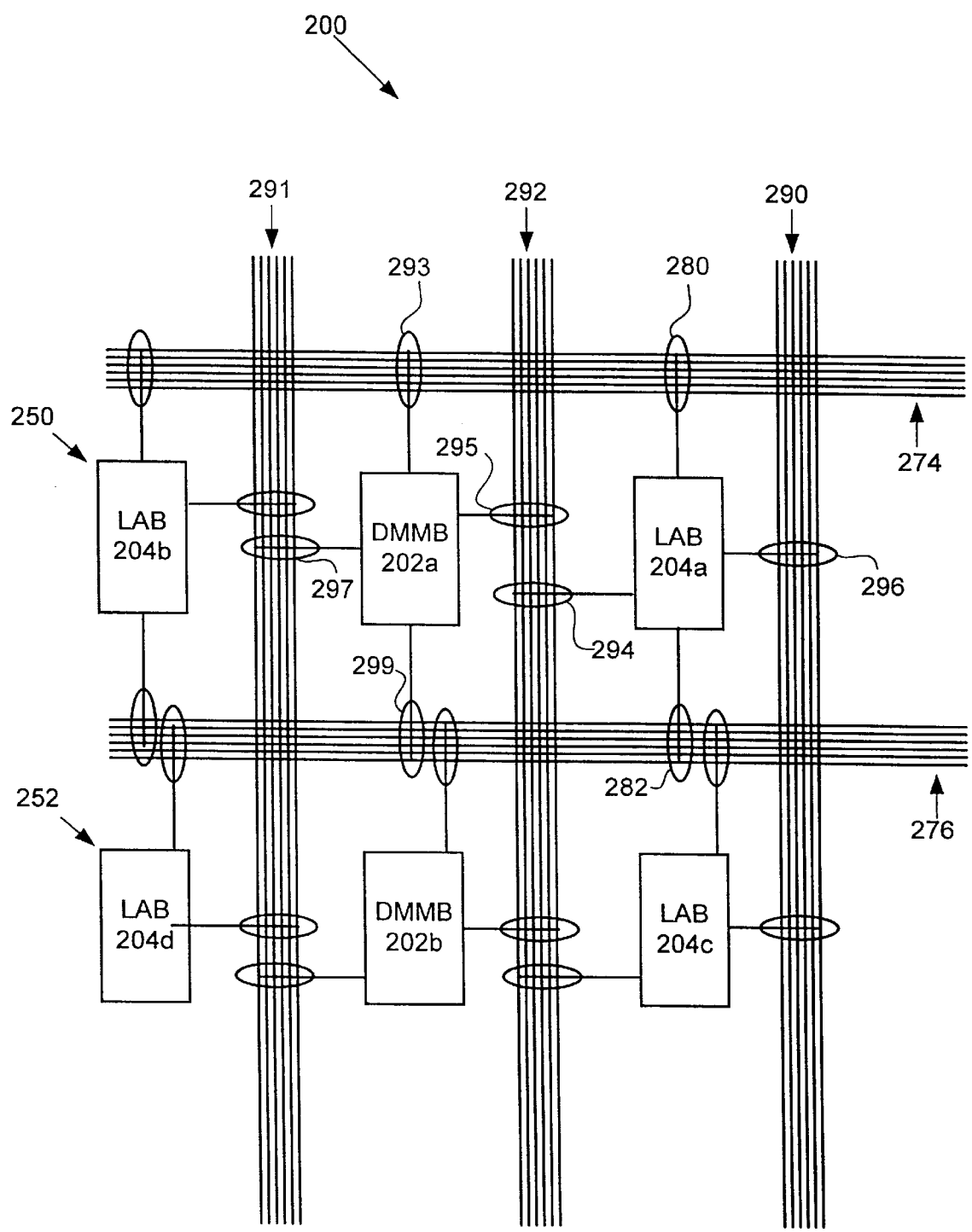
FIG. 2A is an illustration of an embedded array programmable logic device having a dual mode memory block in accordance with one embodiment of the invention.

Referring initially to FIG. 2A an embedded array programmable logic device 200 with at least one dual mode memory block in accordance with one embodiment of the invention will be described. The programmable logic device 200 includes a plurality of logic array blocks (LABs) 204a–204d and a plurality of embedded array blocks that take the form of dual mode memory blocks (DMMBs) 202a–202b. The general architecture of the embedded array programmable logic device will be generally familiar to those knowledgeable of the FLEX10K™ logic family of devices manufactured by the Altera Corporation of San Jose, California. Such an architecture, including the structure of the logic array blocks 204a–204d is described in U.S. Pat. No. 5,550,782 and Altera Data Book 1996, which are incorporated herein by reference. Although only a few logic array blocks and dual mode memory blocks are illustrated, it should be appreciated that any number of blocks may be provided in order to meet the needs of a particular system.

Each of the logic array blocks 204a–204d and dual mode memory blocks 202a–202b may be programmably coupled to either one or both of the plurality of vertical and the plurality of horizontal conductors by appropriately situated programmable connectors. As an example, the LAB 204a which is included in a portion of row 250 may be electrically coupled to a first plurality of horizontal conductors 274 and a second plurality of horizontal conductors 276 by programmable connectors 280 and 282, respectively. In a similar fashion, LAB 204a may be electrically coupled to a first plurality of vertical conductors 290 and a second plurality of vertical conductors 292 by programmable connectors 296 and 294, respectively. In a similar fashion each of the array of DMMBs may be electrically coupled to at least one of each of the plurality of vertical and horizontal conductors. By way of example, DMMB 202a may be electrically coupled to vertical conductors 292 and 291 by way of programmable connectors 295 and 297, respectively, and horizontal conductors 274 and 276 by way of programmable connectors 293 and 299, respectively. In this way, an array of reconfigurable logic and dual mode memory is formed.

Figure 2B:
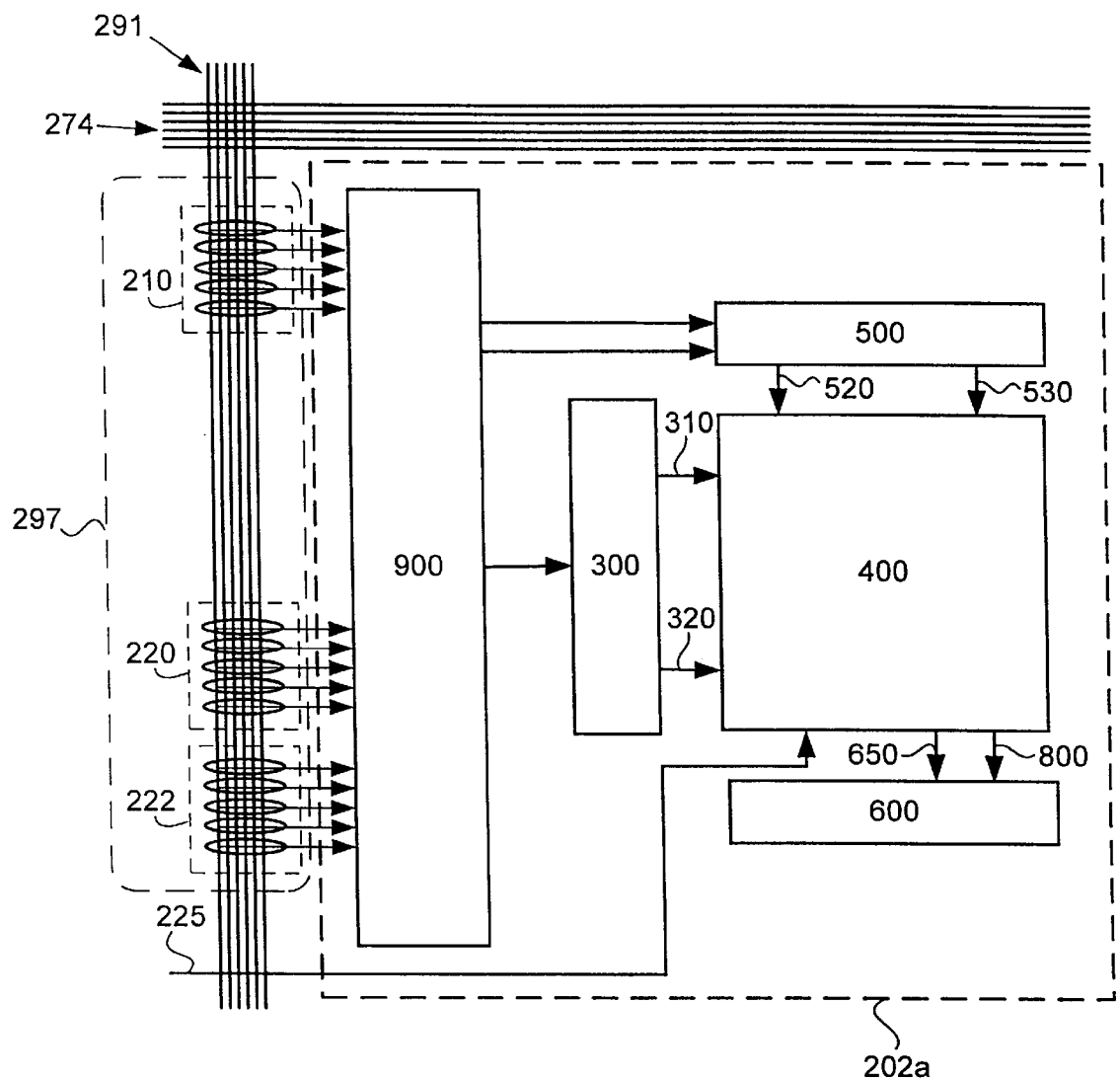
FIG. 2B is a functional block diagram of an embedded array programmable logic architecture having a reconfigurable dual mode memory device as illustrated in FIG. 2A.

FIG. 2B is a functional block diagram of a embedded array programmable logic architecture reconfigurable as a dual mode memory device according to one embodiment of the invention. In the described embodiment, dual mode memory block 202a may be user configured as content addressable memory (CAM) or as Random Access Memory (RAM). As described, dual mode memory block 202a includes an input control block 900 used to couple a plurality of selectively programmed inputs 297 from vertical conductor 291 to a column control unit 500 and a row control unit 300. RAM/CAM mode control input 225 (hereinafter referred to as R/C mode control input) is directly coupled to dual mode memory unit 400. R/C mode control input 225 causes dual mode memory unit 400 to operate as a CAM or a RAM depending upon the state of RIC mode control input 225. In one embodiment, when R/C mode control input 225 goes HIGH (i.e.; representing an associated high voltage level, or digital value of '1') dual mode memory unit 400 is capable of operating as a CAM. Alternatively, when RIC mode control input 225 goes LOW (i.e.; representing an associated low voltage level, or digital value of '0') dual mode memory unit 400 is capable of operating as a RAM.

In the described embodiment, the plurality of selectively programmed inputs 297 may include a plurality of data inputs 210 representing input data to be stored in selected memory locations within dual mode memory unit 400 when configured to operate as a RAM. Alternatively, when dual mode memory unit 400 is configured to operate as a CAM, the plurality of data inputs 210 may represent requested data to be compared with data pre-stored in dual mode memory unit 400. Inputs 297 may also include a first plurality of address inputs 220 which in one embodiment may represent the least significant bits (LSB) of a multi-bit addressing scheme. Inputs 297 may also include a second plurality of address inputs 222 which, in one embodiment, may be representative of the most significant bits (MSB) of a multi-bit addressing scheme.

In the described embodiment, column control unit 500 receives input data 210 by way of input control 900 and transmits it to dual mode memory unit 400 by way of column data signal 520. Column control unit 500 also receives the second plurality of address inputs 222 representative of the most significant bits (or MSB) of a multi-bit addressing scheme. Column control unit 500 then decodes the received address inputs 222 to form an column selection data set which is subsequently transmitted to dual mode memory unit 400 by way of column address signal 530. In this manner, column control unit 500 is capable of selectively enabling selected columns of memory cells included within dual mode memory unit 400 to receive input data 210. In a similar manner, row control unit 300 receives the first plurality of address inputs 220 representative in one embodiment of the least significant address bits (or LSB) by way of input control unit 900 and outputs a read address signal 310 or a write address signal 320 to dual mode memory unit 400.

Figure 3A:
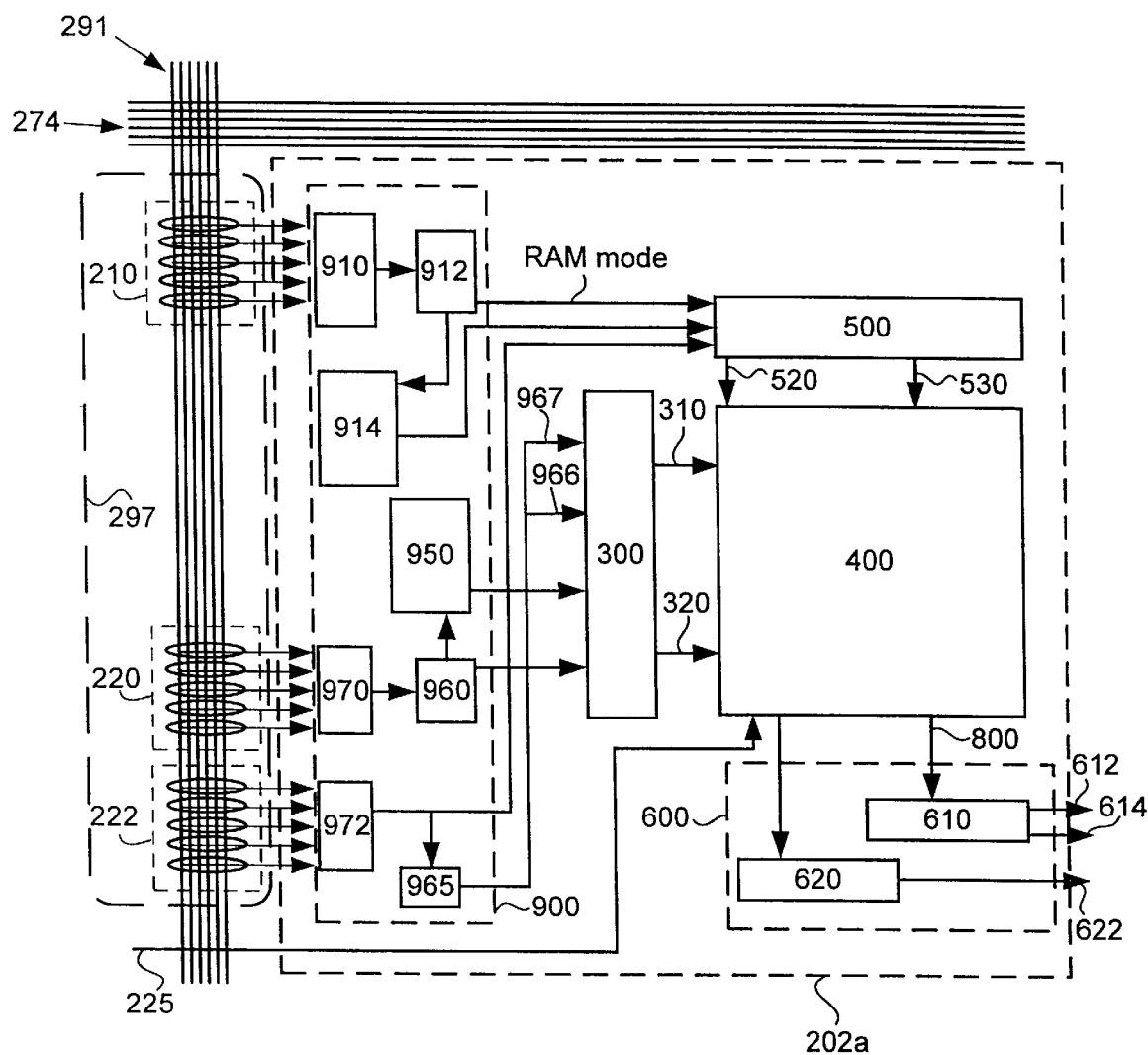
FIG. 3A is a functional block diagram of a dual mode memory block which may be user configured as a content addressable memory or a random access memory where input data may be received by a data in/data buffer combination and forwarded to a comperand unit according to one embodiment of the invention.

Dual mode memory unit 400 communicates with an output control unit 600 by way of output signal 650 when configured to operate as a RAM and a global match output 800 when configured to operate as a CAM. Output control unit 600 may be coupled to output drivers (not shown) programmably coupled to at least of one of the plurality of horizontal conductors or at least one of the plurality of vertical conductors. FIG. 3A is a functional block diagram of dual mode memory block 202a reconfigurable as a content addressable memory or a random access memory by way of R/C mode control input 225 according to one embodiment of the invention. In this embodiment, data in register 910, data buffer 912, comperand 914 address register 970, address register 972, address control 960, read/write enable unit 965, and address decode 950 form input control unit 900 of FIG. 2B.

Figure 3B:
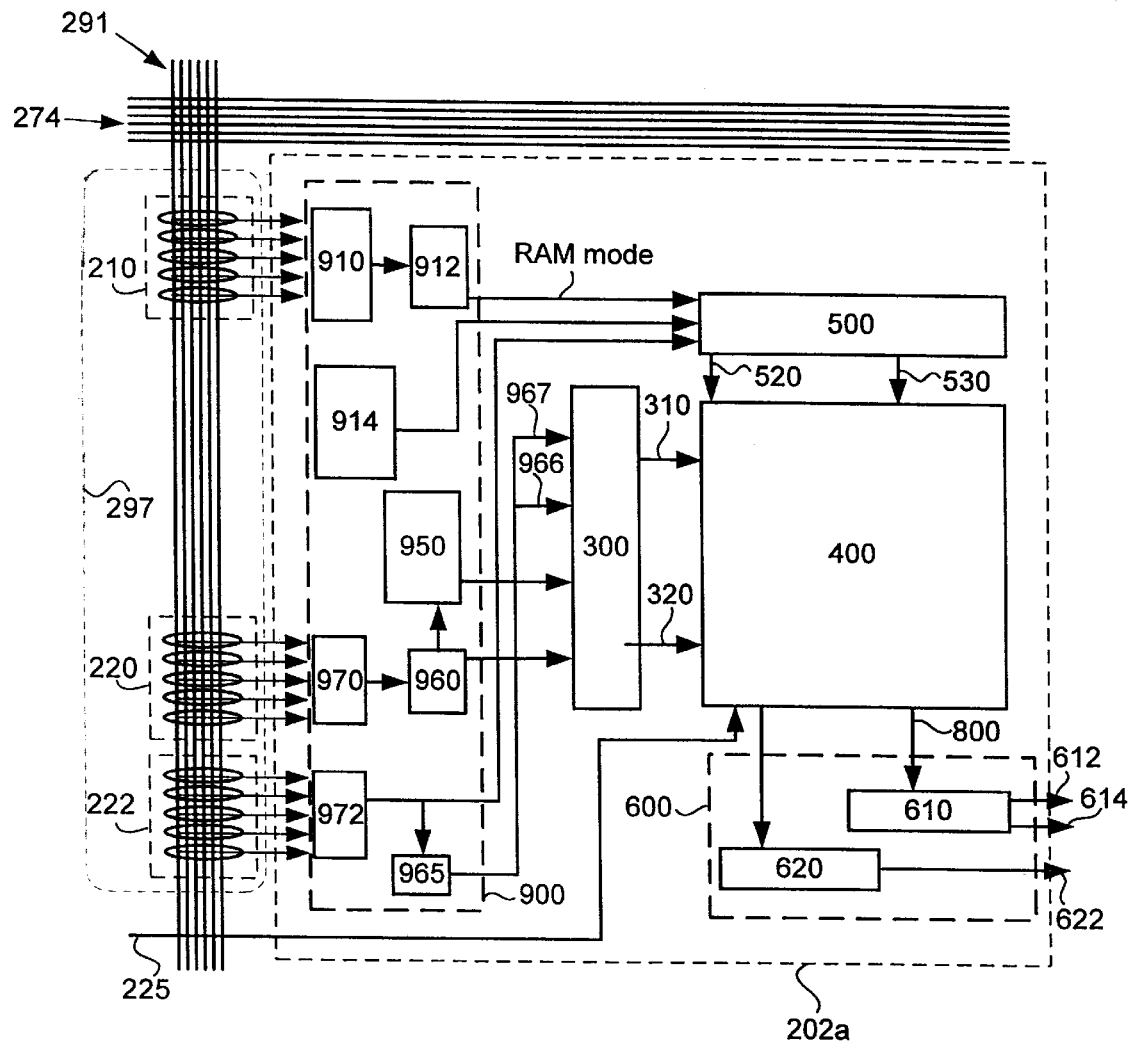
FIG. 3B is a functional block diagram of dual mode memory block user configured as a content addressable memory by way of R/C mode control input wherein input data is received directly by comperand unit according to one embodiment of the invention.

Referring to FIG. 3A, when operable as a CAM, dual mode memory unit 400 may receive input data 210 by way of data in register 910. Data in register 910 receives input data 210 and provides it to the inputs of data buffer 912. Data buffer 912 includes electronic buffers (not shown) which allow it to receive and transfer input data 210 to the inputs of comperand unit 914 which queues input data 210 as requested data. In this embodiment, requested data is compared to pre-stored data within the memory storage cell circuits of dual mode memory unit 400 such that the address locations of any matching stored data included within dual mode memory unit 400, if any, are determined. In another embodiment, input data 210 may be received directly by the inputs of comperand unit 914 as shown by FIG. 3B advantageously, eliminating any delay times associated with data in register 910 and data buffer 912.

Referring again to FIG. 3A, when dual mode memory unit 400 is configured to operate as a RAM, comperand 914 may be bypassed and input data 210 is directly input to the data inputs of column control unit 500 by way of data buffer 912.

In the described embodiment, user address information is input to dual mode memory unit 400 by way of address input unit 970 and address input unit 972. The user address information may be parsed into a first group of address input data 220 which in one embodiment may represent the least significant bits (or LSB) of address information and a second group of address input data 222 which may represent the most significant (or MSB) of address information. In the described embodiment, address input unit 970 receives the first group of address input data 220 and transfers it to address control 960. Address control 960, in turn, generates an output which is forwarded to address encoder 950. By way of example, the first group of address input data 220 may consist of six data bits representative of the five least significant bits of a multi-bit addressing scheme and one control bit. In this scenario, address input unit 970 receives the five address bits of first group of address input data 220 and the one control bit and transfers them to address control 960. Address control 960, in turn, generates six outputs, five of which represent selectable address locations which may be received by address decode 950, the 5th being a read/write control signal which is forwarded directly to row control unit 300. In this embodiment, address decode 950 includes decoders (not shown) which convert the received five address bits of first group of address input data 220 into thirty two bits of read/write row address information. These thirty two bits of address information are in turn forwarded to row control unit 300.

The second group of address input data 222 may be inputted to dual mode memory unit 400 by way of address input unit 972 and column control unit 500. In operation, address input unit 972 receives second group of address input data 222 and forwards it to the address inputs of column control unit 500. By way of example, the address information received by address input 972 may include five address bits associated with the most significant bits of a multi-bit addressing scheme and a write enable bit. The five most significant address bits may be transferred to column control unit 500. Column control unit 500 includes a column address decoder (not shown) which decodes the five most significant bits and generates thirty two column address bits. The write enable bit output from address input 972 forms an input to read/write control unit 965 which generates the read enable RE 966 and write enable WE 967 signals input to row control unit 300.

As discussed above, row control unit 300 receives address information generated by address decode 950. In the described embodiment, row control unit 300 receives address bits generated by address decode 950. Row control unit 300 includes two to one de-multiplexers (not shown) which generate two groups of address bits, one corresponding to a read address and the other corresponding to a write address. By way of example, if address decode 950 outputs to row control unit 300 thirty two read/write address bits, the two to one de-multiplexers included within row control unit 300 will generate a read address signal 3 10 of thirty two bits and a write address signal 320 of thirty two bits. In this embodiment, row control unit 300 also receives complementary signals RE 966 and WE 967 which determine whether the address information at the output of row control unit 300 is to be used to read from or write into dual mode memory unit 400.

In the described embodiment, output unit 600 includes a plurality of output buffer registers 620 and a priority encoder 610. The plurality of output buffer registers 620 may queue data output from dual mode memory unit 400 and transmit it as output data 622 to output drivers (not shown). In another embodiment, output buffer registers 620 may transmit output data to another DMMB or EAB included within the programmable logic device so as to form larger blocks of RAM by cascading additional blocks of memory. Priority encoder 620 may receive the global match data 800 indicative of the match addresses when dual mode memory unit 400 is configured as a CAM. Priority encoder 620 may transmit a SYSMATCH signal 612 indicative of a MATCH or a NO MATCH condition. Priority encoder 610 may also store a plurality of match addresses and generate a MATCH FLAG signal 614 indicative of the total number of match addresses included within dual mode memory unit 400.

Figure 4A:
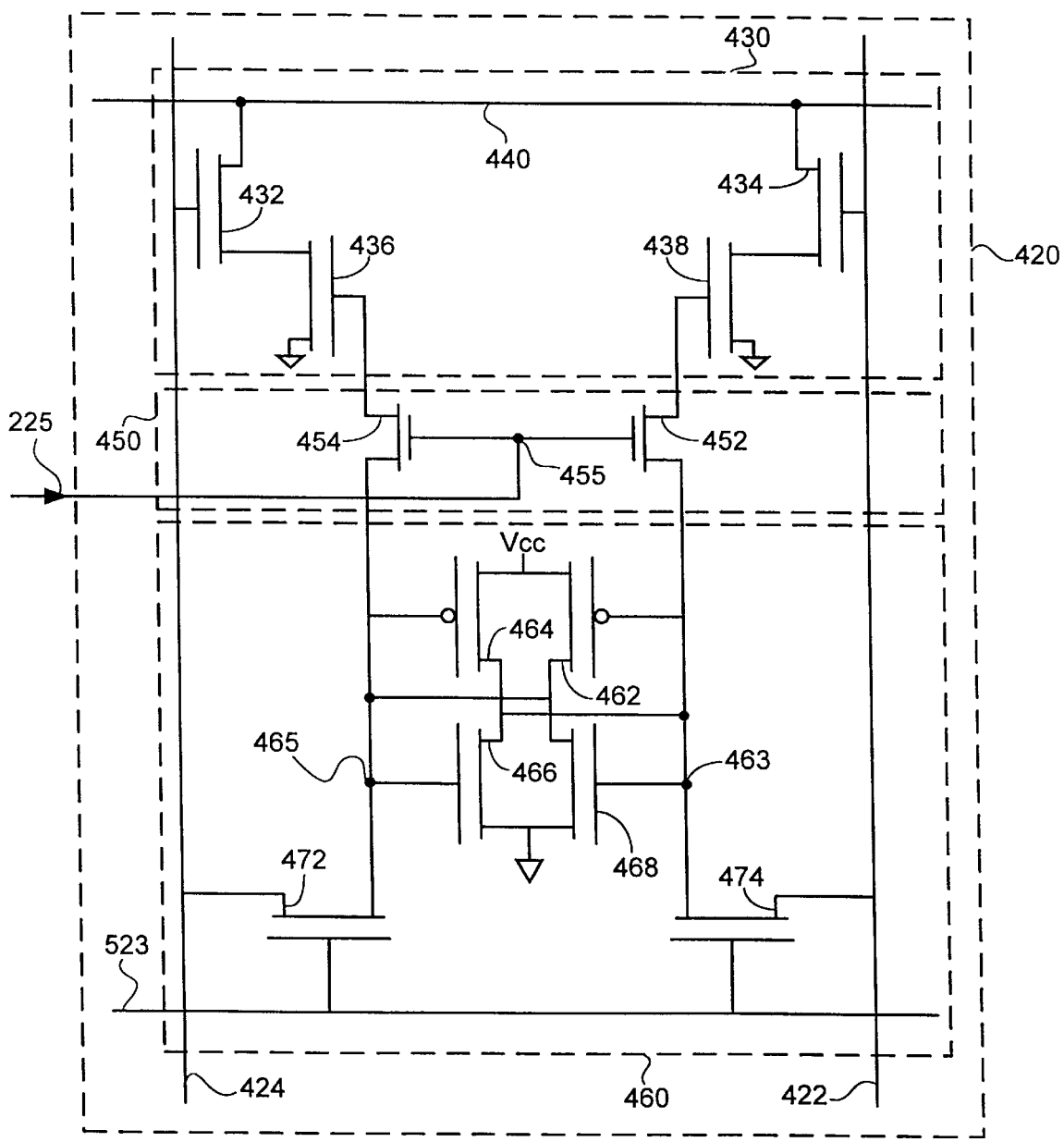
FIG. 4A is a circuit diagram of a dual mode memory cell in accordance with an embodiment of the invention.

In one embodiment, dual mode memory unit 400 includes an array of dual mode memory cells 410, one of which may be dual mode memory cell 420 shown in FIG. 4A. The dual mode memory cell 420 includes a data storage circuit 460, a comparison circuit 430, and a isolator circuit 450.

In the described embodiment, memory storage circuit 460 includes a p-channel transistor 464, an n-channel transistor 466, a p-channel transistor 462, and an n-channel transistor 468 configured to form a static random access memory cell or SRAM cell. The SRAM cell as described is configured as a cross coupled inverter feedback circuit well known to those skilled in the art capable of storing digital data corresponding to a digital one and a digital zero. In another embodiment, memory storage unit 460 may be configured as a dual port memory cell, a read only memory cell or ROM cell, or any other circuit known by those skilled in the art capable of storing of data.

In the described embodiment, an I/O node 465 is electrically connected to the gates of transistors 464 and 466 as well as the drain of transistor 462 and the source of transistor 468. In a similar fashion, a second 10 node 463 is electrically connected to the gates of transistors 462 and 468 as well as the drain of transistor 464 and the source of transistor 466. As configured, the sources of transistors 464 and 462 are electrically coupled to Vcc while the drains of transistors 466 and 468 are coupled to ground.

Memory storage circuit 460 may be electrically coupled to a first data line 424 and a word line 523 by way of n-channel passgate transistor 472. As configured, transistor 472 has a source electrically connected to the first I/O node 465, a drain electrically connected to data line 424, and a gate electrically connected to word line 523. Additionally, memory storage circuit 460 may be electrically coupled to a second data line 422 and word line 523 by way of n-channel passgate transistor 474. As configured, transistor 474 has a source electrically connected to second I/O node 463, a drain electrically connected to data line 422, and a gate electrically connected to word line 523. When word line 523 goes HIGH, transistors 472 and 474 are substantially conducting such that 10 nodes 463 and 465 are electrically coupled to data lines 422 and 424, respectively. In this manner, first I/O node 465 of memory storage circuit 460 is capable of receiving data to be stored (referred to those skilled in the art as a WRITE operation) and transmitting stored data (known to those skilled in the art as a READ operation) by way of data line 424. In a similar fashion, second I/O node 463 of memory storage circuit 460 is capable of receiving data to be stored and transmitting stored data by way of data line 422. In operation, first and second I/O nodes 465 and 463 represent complementary data states.

Comparison circuit 430 includes an n-channel transistor 432 whose drain is electrically connected to the source of an n-channel transistor 436. Comparison circuit 430 also includes an n-channel transistor 434 whose drain is electrically coupled to the source of an n-channel transistor 438. The sources of n-channel transistors 432 and 434 are electrically connected to a match line 440 while the drains of transistors 436 and 438 are coupled to ground. A match line 440 is electrically coupled to the sources of transistors 432 and 434 and forms a portion of an input to global match line 800.

Isolation circuit 450 acts to couple memory storage circuit 460 and comparison circuit 430 by way of n-channel transistors 454 and 452. As configured, transistor 454 has a source electrically connected to the gate of transistor 436 of comparison circuit 430 and a drain connected to I/O node 465 of memory storage circuit 460. In a similar fashion, a transistor 452 has a source electrically connected to the gate of transistor 438 of comparison circuit 430 and a drain electrically connected to I/O node 463 of memory storage circuit 460.

R/C mode control input 225 is electrically coupled to the gates of both transistors 454 and 452 at a node 455 in such a manner as to cause both transistors to conduct when R/C mode control input 225 is HIGH. In this way, data storage circuit 460 is electrically coupled to comparison circuit 430. Alternatively, when RIC mode control input 225 is LOW, transistors 452 and 454 are substantially non-conducting effectively isolating memory storage circuit 460 and comparison circuit 430. In this way, dual mode memory unit 400 may operate as a CAM when comparison circuit 430 and memory storage circuit 460 are electrically coupled by way of isolator circuit 450. Alternatively, in this embodiment, dual mode memory circuit 420 may operate exclusively as a RAM when comparison circuit 430 and memory storage circuit 460 are electrically isolated by way of isolator circuit 450.

In operation, when a user desires to configure dual mode memory unit 400 for use exclusively as a SRAM, R/C mode control input 225 is brought LOW such that both transistors 454 and 452 of isolation circuit 450 are turned OFF. In this manner, comparison circuit 430 and match line 440 are effectively electrically disconnected from memory storage circuit 460. In this manner, in the RAM only mode, memory storage circuit 460 configured as SRAM becomes the only interactive circuit of dual mode memory cell 420 such that dual mode memory unit 400 acts exclusively as SRAM.

Alternatively, if a user wishes to configure dual mode memory 400 for use a CAM, R/C mode control input 225 is brought HIGH such that both transistors 454 and 452 of isolation circuit 450 are turned ON thereby electrically coupling comparison circuit 430 to 10 nodes 465 and 463 of memory storage circuit 460. In this manner, in the CAM mode, both comparison circuit 430, matchline 440, and memory storage circuit 460 interact to function as a content addressable memory.

Once configured to operate as a CAM, data stored in memory storage circuit 460 may be used to compare to any data input by way of comperand 914. By way of example, match line 440 forms an input to global match line 800 which may be electrically connected to a data register similar to priority encoder 610 as discussed above. In this embodiment, matchline 440 may be precharged to a HIGH state prior to the actual comparison operation. A single BIT of a data word DATA of predetermined length queued in comparator 914 may drive data lines 424 and 422 to BIT and its complement/BIT, respectively, by the action of column control unit 500 and row control unit 300 as discussed above. In a similar fashion, a data word COMP may be pre-stored in a portion of memory cell array 410 by a previous WRITE operation. In this embodiment, data word COMP may have a single bit COMPBIT stored in memory storage cell 460. By way of example, if COMPBIT has been written into memory storage circuit 460 in a previous WRITE operation by driving data line 424 to COMPBIT and data line 422 to COMPBIT, a voltage level corresponding to /COMPBIT may be present at I/O node 465. Similarly, a voltage level corresponding to COMPBIT may be present at I/O node 463.

During a COMPARE operation, word line 523 is driven LOW by the action of row control unit 300 which turns OFF transistors 472 and 474 decoupling output nodes 463 and 465 from data lines 422 and 424, respectively. However, since RIC mode switch is HIGH, I/O nodes 463 and 465 are electrically coupled to the comparison circuit 430 by way of the gates of transistors 436 and 438. In this way, I/O node 463 supplies a first voltage level corresponding to COMPBIT to the gate of transistor 438 and I/O node 465 supplies a second voltage level corresponding to /COMPBIT to the gate of transistor 436.

A bit match occurs when COMPBIT stored in memory storage circuit 460 and the corresponding BIT stored in comperand 914 are of substantially similar voltage levels corresponding to the same digital value. In this manner, when a match occurs, comparison circuit 430 maintains matchline 440 at its precharged HIGH state. However, if COMPBIT and BIT do not match, i.e.; are of substantially different voltage levels so as to be considered different digital values, comparison circuit 430 acts to bring matchline 440 to substantially ground or zero volts which is comprehended by circuitry (not shown) coupled to global match line 800 as a NO MATCH condition. Alternatively, for a MATCH condition to occur, all bits of DATA and COMP must match as indicated by all match lines remaining HIGH.

For example, if COMPBIT is corresponds to a digital 1 then I/O node 465 is driven LOW to a voltage level corresponding to a digital "0", or substantially 0, volts which turns transistor 436 OFF. Similarly 110 node 463 is driven HIGH to a voltage level corresponding to a digital "1", or substantially Vcc, which turns transistor 438 ON. If BIT also corresponds to a digital 1 (indicative of a MATCH), data line 424 is driven HIGH which turns transistor 432 ON; similarly, data line 422 is driven LOW which turns OFF transistor 434. In this manner, matchline 440 remains HIGH. Alternatively, if COMPBIT and BIT do not match, then either pair of transistors 432, 436 or 434,438 will bring matchline 440 LOW indicative of a NO MATCH condition.

Figure 4B:
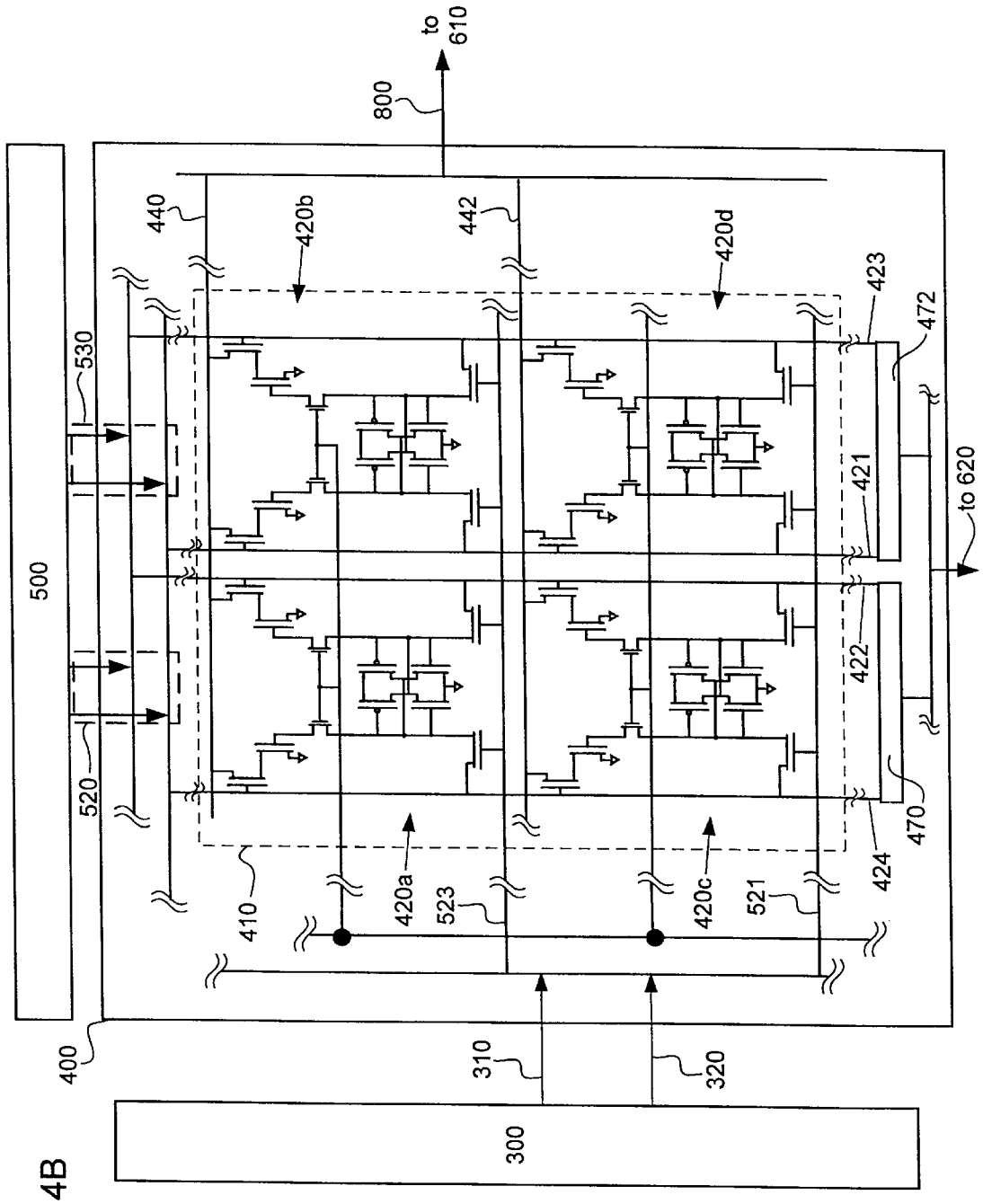
FIG. 4B is an illustration of a portion of array of dual mode memory cells included within dual mode memory unit in accordance with an embodiment of the invention.

FIG. 4B is an illustration of a portion of array of dual mode memory cells 410 including dual mode memory cells 420a–420d included within dual mode memory unit 400 in accordance with an embodiment of the invention. In this embodiment, column control unit 500 supplies received data by way of column data signal 520 as well as address selection data by way of column address signal 530. When configured as a RAM, column address signal 530 selectably enables various ones of data lines 421–424 to facilitate the receipt of data to be stored during a WRITE operation or the transmission of data to output during a READ operation. Row control unit 300 outputs read address signal 310 or write address signal 320 which selectably enables or disables various word lines such as 523 and 521. Data lines 421–424 .are coupled to a plurality of sense amps 470–472 which resolve the voltage levels output by the various I/O nodes of dual mode memory cells included with array 410 into a form consistent with data to be transmitted to output registers 620. When configured as a CAM by the action of RIC mode input 225, each one of a plurality match lines such as 440 and 442 are coupled to form output matchline 800 which drives the global match data to priority encoder 610.

Although the foregoing invention has been described in some detail for purposes of clarity of understanding, it will be apparent that certain changes and modifications may be practiced within the scope of the appended claims. It should be noted that there are may alternative ways of implementing the present invention. By way of example, the random access memory mode may be operable in one embodiment as a static random access memory (SRAM), a dual port memory, or as a read only memory (ROM). The actual structure of the memory cell may be widely varied as will be appreciated by those skilled in the art.

The invention has been described in the context of a programmable logic device that has an embedded array block architecture. However, it should be apparent that the invention may also be implemented in other programmable logic architectures such as field programmable gate array type architectures. Further, in the described embodiment, each of the embedded array blocks was described as being a dual mode memory block. However again, this is not a requirement. Rather, some of the embedded array blocks may be configured as dual mode memory while others are configured as single mode memory or any other suitable structures. Therefore, the present examples are to be considered as illustrative and not restrictive, and the invention is not to be limited to the details given herein, but may be modified within the scope of the appended claims.

What is claimed is:

1. An apparatus for providing a first type function and a second type function, comprising:

a dual mode function block having a first type function cell and a second type function cell; and an isolation circuit coupled to the dual mode function block, wherein the isolation circuit is arranged to electrically decouple the first type function cell from the second type function cell such that the dual mode function block operates as the first type function when the isolation circuit is not activated and wherein when the isolation circuit is activated, the isolation circuit electrically couples the first type function cell to the second type function cell such that the dual mode function block operates as the second type function, and wherein the first type function is a random access memory function and wherein the second type function is a content addressable memory function.

2. An apparatus as recited in claim 1, wherein the isolation circuit and the dual mode function block are included in an integrated circuit.

3. An apparatus as recited in claim 2, wherein the integrated circuit further comprises:

a plurality of dual mode function blocks; and an array of programmably interconnected logic cells suitable for use in implementing programmed logic functions coupled to the plurality of dual mode function blocks.

4. An apparatus as recited in claim 2, wherein the integrated circuit is a programmable logic device.

5. An apparatus as recited in claim 1, further comprising:

a mode control switch circuit coupled to the isolation circuit suitable for selectively activating the isolation circuit.

6. An apparatus as recited in claim 1, wherein the dual mode function block further comprises:

a data storage circuit for storing data;

a comparison circuit for comparing data stored in the data storage circuit with requested data; and a match line for indicating whether the stored data and the requested data match.

7. An apparatus as recited in claim 6 wherein the isolation circuit electrically decouples the data storage circuit from the comparison circuit and match line in a first mode such that the dual mode function block operates as a static random access memory.

8. An apparatus as recited in claim 1 wherein the isolation circuit further comprises:

a first isolating device; and a second isolating device.

9. An apparatus as recited in claim 8, wherein the first isolating device and the second isolating device each include an n-channel transistor.

10. An apparatus as recited in claim 8, wherein the first isolating device and the second isolating device each include a p-channel transistor.

11. An apparatus as recited in claim 8, wherein when the isolation circuit is active, the first isolating device is active and the second isolating device is not active.

12. A method for providing a first type function and a second type function from a dual mode function block having a first type function cell and a second type function cell, comprising:

coupling the dual mode function block to an isolation circuit;

activating the isolation circuit which electrically couples the first type function cell to the second type function cell such that the dual mode function block operates as the second type function; and deactivating the isolation circuit which electrically decouples the first type function cell from the second type function cell such that the dual mode function block operates as the first type function, wherein the first type function is a random access memory function and wherein the second type function is a content addressable memory function.

13. A method as recited in claim 12 wherein the isolation circuit and the dual mode function block are included in an integrated circuit.

14. A method as recited in claim 13, wherein the integrated circuit further comprises:

a plurality of dual mode function blocks; and an array of programmably interconnected logic cells suitable for use in implementing programmed logic functions coupled to the plurality of dual mode function blocks.

15. A method as recited in claim 12, further comprising:

a mode control switch circuit coupled to the isolation circuit suitable for selectively activating the isolation circuit.

16. A method as recited in claim 12 wherein the dual mode function block further comprises:

a data storage circuit for storing data;

a comparison circuit for comparing data stored in the data storage circuit with requested data; and a match line for indicating whether the stored data and the requested data match.

17. A method as recited in claim 16 wherein the isolation circuit electrically decouples the data storage circuit from the comparison circuit and match line in a first mode such that the dual mode function block operates as a static random access memory.

18. A method as recited in claim 12 wherein the isolation circuit further comprises:

a first isolating device; and a second isolating device.

* * * * *